(12) United States Patent
Strmiska et al.

(10) Patent No.: US 9,915,085 B2
(45) Date of Patent: Mar. 13, 2018

(54) SYSTEMS AND METHODS FOR SECURING PANELS TO INFORMATION HANDLING SYSTEM CHASSIS

(71) Applicant: Dell Products, LP, Round Rock, TX (US)

(72) Inventors: Bernard Strmiska, Round Rock, TX (US); Richard A. Crisp, Austin, TX (US); Peter Kaltenbach, Austin, TX (US); Brad Collins, Austin, TX (US); Kristy Baldwin, Holland, MI (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/474,426

(22) Filed: Mar. 30, 2017

(65) Prior Publication Data

US 2017/0295663 A1  Oct. 12, 2017

Related U.S. Application Data

(62) Division of application No. 15/096,333, filed on Apr. 12, 2016, now Pat. No. 9,668,371.

(51) Int. Cl.
| | |
|---|---|
| *H05K 7/00* | (2006.01) |
| *E05C 1/16* | (2006.01) |
| *E05C 1/00* | (2006.01) |
| *H05K 7/14* | (2006.01) |

(52) U.S. Cl.
CPC .............. *E05C 1/166* (2013.01); *E05C 1/006* (2013.01); *H05K 7/1489* (2013.01)

(58) Field of Classification Search
CPC .......... H05K 7/18; H05K 7/1488; H05K 5/02; H05K 5/0214; H05K 5/0221
See application file for complete search history.

(56) References Cited

U.S. PATENT DOCUMENTS

| | | | |
|---|---|---|---|
| 3,837,195 A * | 9/1974 | Pelto ................. | E05L 347/0038 70/276 |
| 9,280,191 B2 | 3/2016 | Rahardjo et al. | |
| 9,668,371 B1 * | 5/2017 | Strmiska ................. | E05C 1/006 |
| 2012/0131967 A1 * | 5/2012 | Sanchez Giraldez ... | A41F 1/002 70/276 |

(Continued)

OTHER PUBLICATIONS

Dell, Dell PowerEdge R730, Owners Manual, 2016, 173 pgs.

(Continued)

*Primary Examiner* — Daniel J Rohrhoff
(74) *Attorney, Agent, or Firm* — Egan Peterman Enders Huston

(57) ABSTRACT

Systems and methods that may be implemented to secure a bezel over a face of an information handling system chassis by using magnetic force to draw in and retain a ferromagnetic bezel latch pin in a latching position relative to complementary latch structure of the chassis. The disclosed systems and methods may be implemented in a manner that minimizes functional intrusions on the front (or other side) of a chassis enclosure to which a bezel is secured, that reduces the number and/or complexity of mechanical features that are conventionally employed, and/or that presents both an intuitive and pleasant user experience for the end user.

15 Claims, 13 Drawing Sheets

(56) References Cited

U.S. PATENT DOCUMENTS

| | | | |
|---|---|---|---|
| 2013/0038988 A1* | 2/2013 | Chen .................... | G06F 1/1677 |
| | | | 361/679.01 |
| 2015/0277487 A1* | 10/2015 | Gerst .................... | G06F 1/1626 |
| | | | 361/679.01 |
| 2017/0013732 A1 | 1/2017 | Kipfer | |
| 2017/0020013 A1* | 1/2017 | Chuang ............... | H05K 5/0021 |

OTHER PUBLICATIONS

Dell, Dell PowerEdge 2950 Systems, Hardware Owners Manual, 2006, 182 pgs.

Strmiska et al., "Systems and Methods for Securing Panels to Information Handling System Chassis", U.S. Appl. No. 15/096,333, filed Apr. 12, 2016.

\* cited by examiner

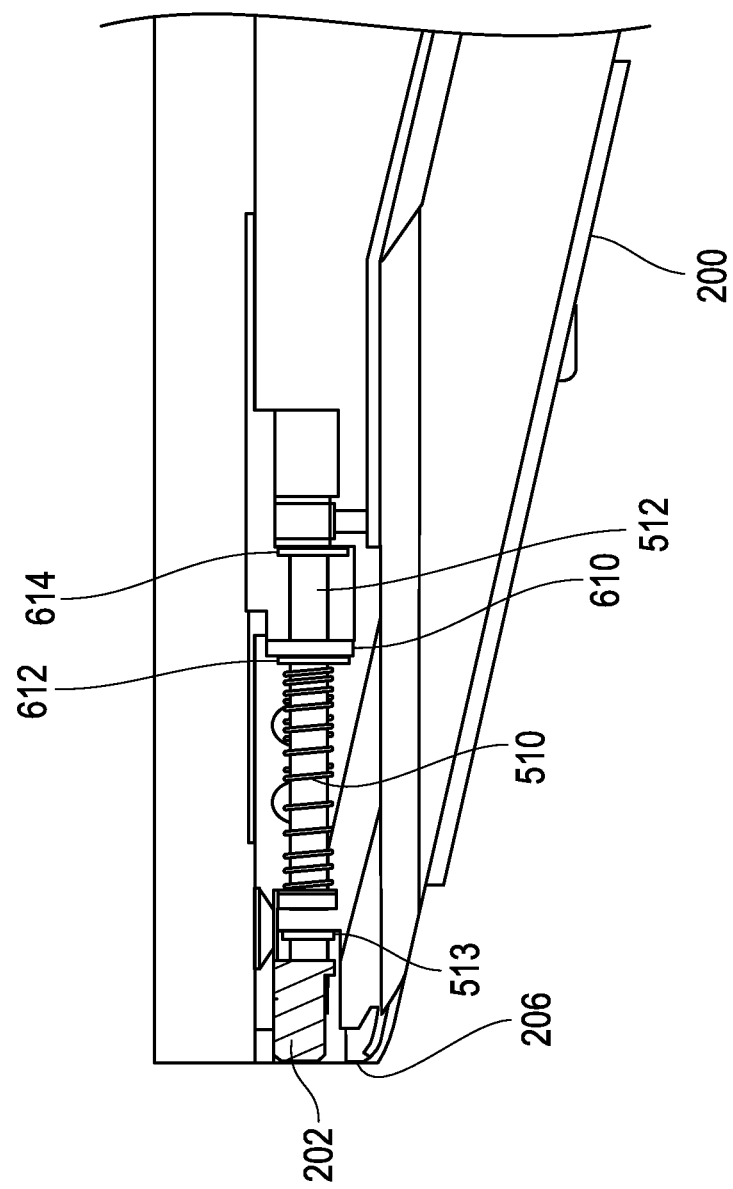

SYSTEMS AND METHODS FOR SECURING PANELS TO INFORMATION HANDLING SYSTEM CHASSIS

This application is a divisional of U.S. patent application Ser. No. 15/096,333, filed on Apr. 12, 2016 and entitled "Systems And Methods For Securing Panels To Information Handling System Chassis" which is incorporated herein by reference in its entirety for all purposes.

TECHNICAL FIELD

This application relates to information handling system chassis and, more particularly, to securing panels to information handling system chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

FIG. 1 illustrates a rear backside view of a first end 114 of an elongated front bezel 100 having a conventional latch mechanism for securing the bezel 100 within a complementary-dimensioned front recess of a rack mount chassis of an information handling system. As shown in FIG. 1, the conventional latch mechanism includes a horizontally-slidable latch assembly that has two outwardly extended bars 110 that are coupled to outer arms 122 that are slidably coupled to bezel 100 by virtue of slots 123 that are slidably received around bezel posts 124. Inner arms 118 of the latch assembly are coupled to a slidable actuator 116 that may be manipulated in an inwardly sliding direction by the hand of a human user. Outwardly extended bars 110 and outer arms 122 are outwardly biased by compressed springs 120 in a manner that keeps bars 110 outwardly extended from first end 114 of bezel 100 at all times, except when bars 110 are displaced inward into bezel 100 by outside force in the direction of the arrows. The opposite (second) end of the elongated bezel has only fixed and non-retractable protruding hooks (not shown) that protrude outwardly from the second end of the bezel.

In the conventional arrangement of FIG. 1, bars 110 are configured to be displaced inward toward the body of bezel 100 by contact with exterior surfaces of an information handling system chassis until bars 110 are received within complementary latch openings defined at the inner edge of the front recess near a rack mounting ear of the chassis, and into which the posts extend outward by virtue of constant outward bias from compressed springs 120 to secure the bezel 100 to the chassis. In this regard, bezel 114 is first positioned in angled relationship with the chassis so that only fixed hooks of the second end of the bezel 114 positioned within corresponding openings on a second end of the chassis recess. Then the first end of bezel 114 is brought together with and into the front recess of the chassis. Sloped mating surfaces 112 are provided on each bar 110 to provide for a sliding interference contact with the front exterior surface of a chassis to progressively displace bars 110 inward as first end 114 of bezel 100 is pushed into the chassis recess until bezel 100 is seated within the front recess of the chassis and bars 110 are aligned to spring outward to be received within the corresponding latch openings in latching position that holds bezel 100 within the front recess of the chassis. A user may manually retract the bars 110 from the latch openings by inward manipulation of slidable actuator 116 to cause inward retraction of bars 110 out of locking engagement with the corresponding latch openings defined at the inner edge of the front recess of a chassis to allow bezel 100 to be removed from the front recess.

SUMMARY

Systems and methods are disclosed herein that may be implemented to secure a panel within or on a face of an information handling system chassis by using magnetic force to draw in and retain a ferromagnetic panel latch pin in a latching position relative to complementary latch structure of the chassis. In one embodiment, the disclosed systems and methods may be implemented in a manner that minimizes functional intrusions on the front (or other side) of a chassis enclosure to which a panel is secured, that reduces the number and/or complexity of mechanical features that are conventionally employed, and/or that presents both an intuitive and pleasant user experience for the end user. Examples of panels that may be so secured using the disclosed systems and methods include, but are not limited to, bezels (e.g., functional and stylized or cosmetic panels), substantially flat-surfaced access panels that serve a security function, etc. In one embodiment, the disclosed systems and methods may be advantageously implemented to allow a panel to be securely latched to an information handling system chassis (e.g., such as securing a front bezel to the front of a rack mounted server chassis) in a manner that reduces required latch mechanism space within the chassis, e.g., such as a rack mounted server system having very limited/restricted space for a front panel to interact with and secure to the chassis, while still allowing high density storage solutions, and without restricting airflow into the chassis.

In one embodiment, a server panel may be secured to the front of a rack mounted chassis while utilizing the minimal available interaction points on the chassis, e.g., with no obstruction of high density storage solutions and/or chassis cooling airflow, and/or while maintaining ability to present I/O (e.g., USB and other type interconnects, etc.) and user interface elements (e.g., power button/switch, status lights, etc.) on rack mounting ears of the chassis that are used to secure the chassis to a rack. This capability may be utilized, for example, to allow nearly un-restricted airflow into the system and to avoid features on the front of a chassis which are not important to the basic system functionality. It also may be utilized in another example to enable functional intrusions to be minimized on the front of existing and yet-to-be-designed chassis systems, while also minimizing mechanical features which detract from clean, clear branding and industrial design being developed for servers and storage.

Advantageously, the disclosed systems and methods may be implemented in one embodiment to provide a space efficient and minimal panel latch space solution in a manner to provide a panel latch mechanism that provides an intuitive user experience for end users attaching and removing the panel from engagement with the chassis. In a further embodiment, a server panel may be so secured to the front of a rack mounted chassis in a manner that meets any required minimum pull forces based on usability, safety, and security. In yet another embodiment, one or more of the proceeding advantages may be realized by the disclosed systems and methods while at the same time causing no scratching/marring of cosmetic surfaces such as a front surface of a chassis, e.g., using one or more latching pins that do not contact the front surface of the chassis during panel installation and securement tasks.

In one embodiment, a latching system may be provided for securing a front panel (e.g., carrying manufacturer brand and system information, as well as presenting a unique and consistent design language) to any chassis within a family of computing devices, without relying on physical contact between the chassis and the panel during installation of the panel in secured relationship to the chassis. In another embodiment, the disclosed systems and methods may be implemented using a non-marring surface latching solution. In a further embodiment, a "straight-in" panel latching solution (e.g., that is a non-toeing, non-handed solution) may be provided. In one embodiment, a frictionless panel latching mechanism may be provided, e.g., using pre-loaded pins when the panel is latched in or to the chassis. In yet another embodiment, the disclosed systems and methods may be implemented in a security panel configuration to provide the ability to lock a panel latch mechanism (e.g., by mechanically latching pre-loaded panel pins in engagement with the chassis) so that the mechanism cannot be actuated either intentionally in unauthorized manner, accidentally, or due to external environmental conditions (e.g., such as shock, vibration, external magnetic fields, etc.).

In one embodiment, the disclosed systems and methods may be advantageously implemented in one embodiment as rack mounted servers increase in storage density and power density, and physical challenges arise both for mechanically securing front panels (e.g., such as front bezels) to the rack mount chassis, as well as for providing adequate chassis airflow to meet thermal challenges. Examples of such embodiments include server designs as they increasingly come under challenges to package more components and features in pre-existing defined spaces (e.g., 1u, 2u, etc. chassis enclosures), and meet higher densities with regards to storage, functionality, and power. In such an embodiment, input/output (IO) connections, branding and user interface elements are moved to the rack mounting ears due to the higher density storage requirements, further reducing opportunities to secure a front panel to the front of the rack mount chassis. As such, the disclosed systems and methods may be advantageously implemented in server configuration embodiments having correspondingly reduced area for securing of accessory panels, loss of real-estate for branding, system information, Input/Output (IO), and user interaction points.

In yet another embodiment, the disclosed systems and methods may be implemented in server configuration environments where there is an emphasis on allowing nearly un-restricted airflow into the system. In a further embodiment, the disclosed systems and methods may be advantageously implemented to secure panels using latch pins that may remain retracted into a panel end, and not extend, until the panel has been placed in an installed position within or on a face of an information handling system chassis, so as to protect and not scratch exterior cosmetic surfaces (e.g., control panel, user touch interface) on a chassis enclosure rack ear. Such exterior cosmetic surfaces are scratched during panel installation by contact with bars 110 when using the conventional outwardly extending bars 110 of conventional latch mechanism of FIG. 1.

In one respect, disclosed herein is a panel configured to be received over an opening of a chassis enclosure, the panel including: a panel body; and at least one ferromagnetic latching pin provided within at least one edge of the panel. The latching pin may be configured to move outward from the edge of the panel to at least partially extend from the panel edge toward a side of the chassis opening to secure the panel over the chassis enclosure opening in response to an external magnetic force applied to the latching pin from the side of the chassis opening.

In another respect, disclosed herein is a chassis enclosure system for an information handling system, including: chassis enclosure having an opening defined therein and configured to receive a panel over the opening; and at least one magnet mounted at one or more sides of the chassis enclosure opening, the magnet being positioned to apply a magnetic force to a ferromagnetic latching pin provided within at least one edge of the panel when the panel is received over the chassis enclosure opening so as to cause the latching pin to move outward from the edge of the panel to at least partially extend from the panel edge toward the side of the chassis opening to secure the panel over the chassis enclosure opening.

In yet another respect, disclosed herein is a method of securing a panel over an opening of a chassis enclosure, including positioning the panel over the opening of the chassis enclosure to cause at least one ferromagnetic latching pin to move outward from an edge of the panel to at least partially extend from the panel edge toward a side of the chassis opening to secure the panel over the chassis enclosure opening in response to an external magnetic force applied to the latching pin from the side of the chassis opening.

BRIEF DESCRIPTION OF THE DRAWINGS

FIG. 6B illustrates a partial overhead cross sectional view of a front panel installed within a chassis enclosure opening according to one exemplary embodiment of the disclosed systems and methods.

DESCRIPTION OF ILLUSTRATIVE EMBODIMENTS

Figure 1:
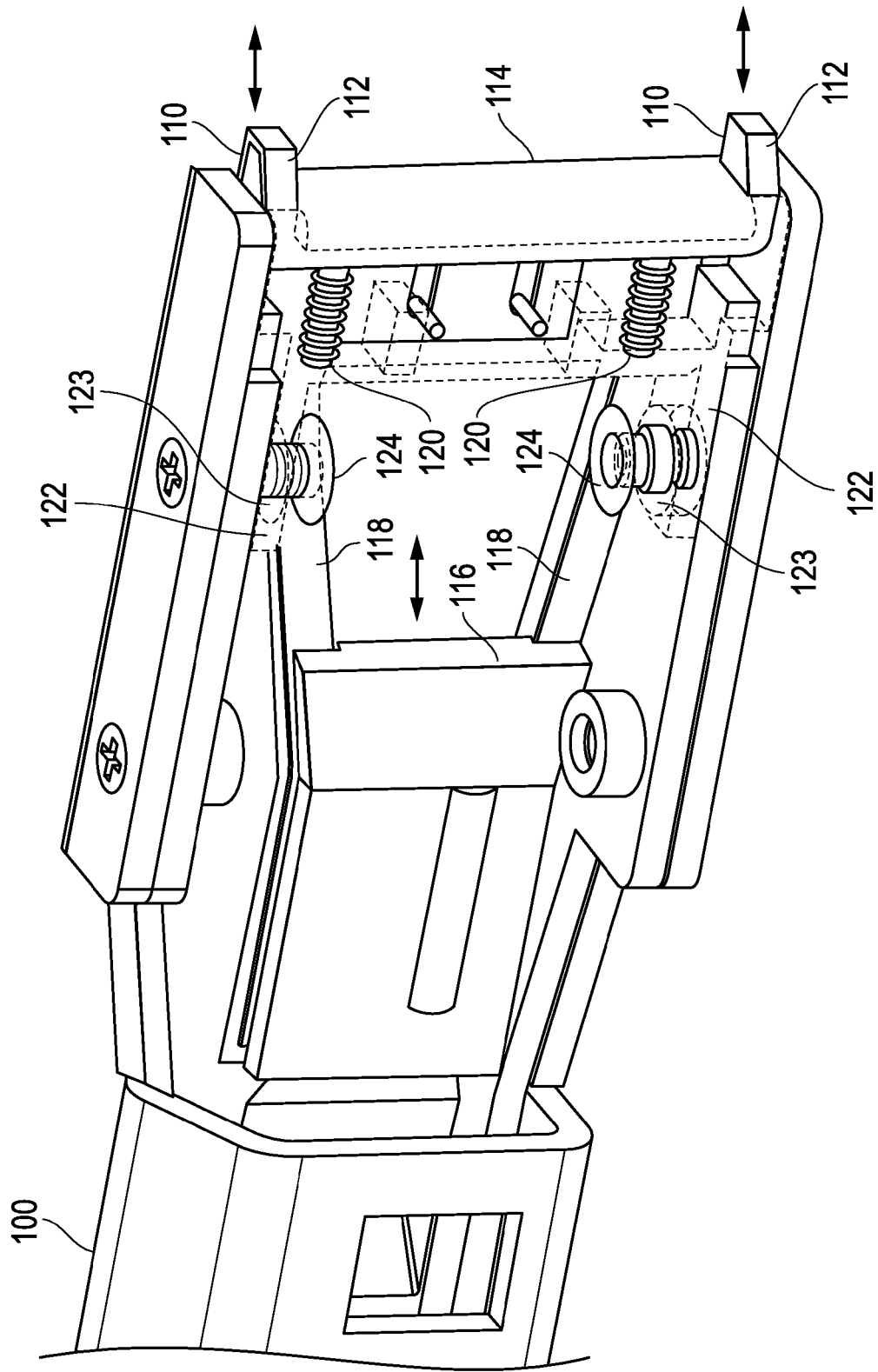
FIG. 1 illustrates a rear view of a first end of an elongated front panel having a conventional latch mechanism.
Figure 2:
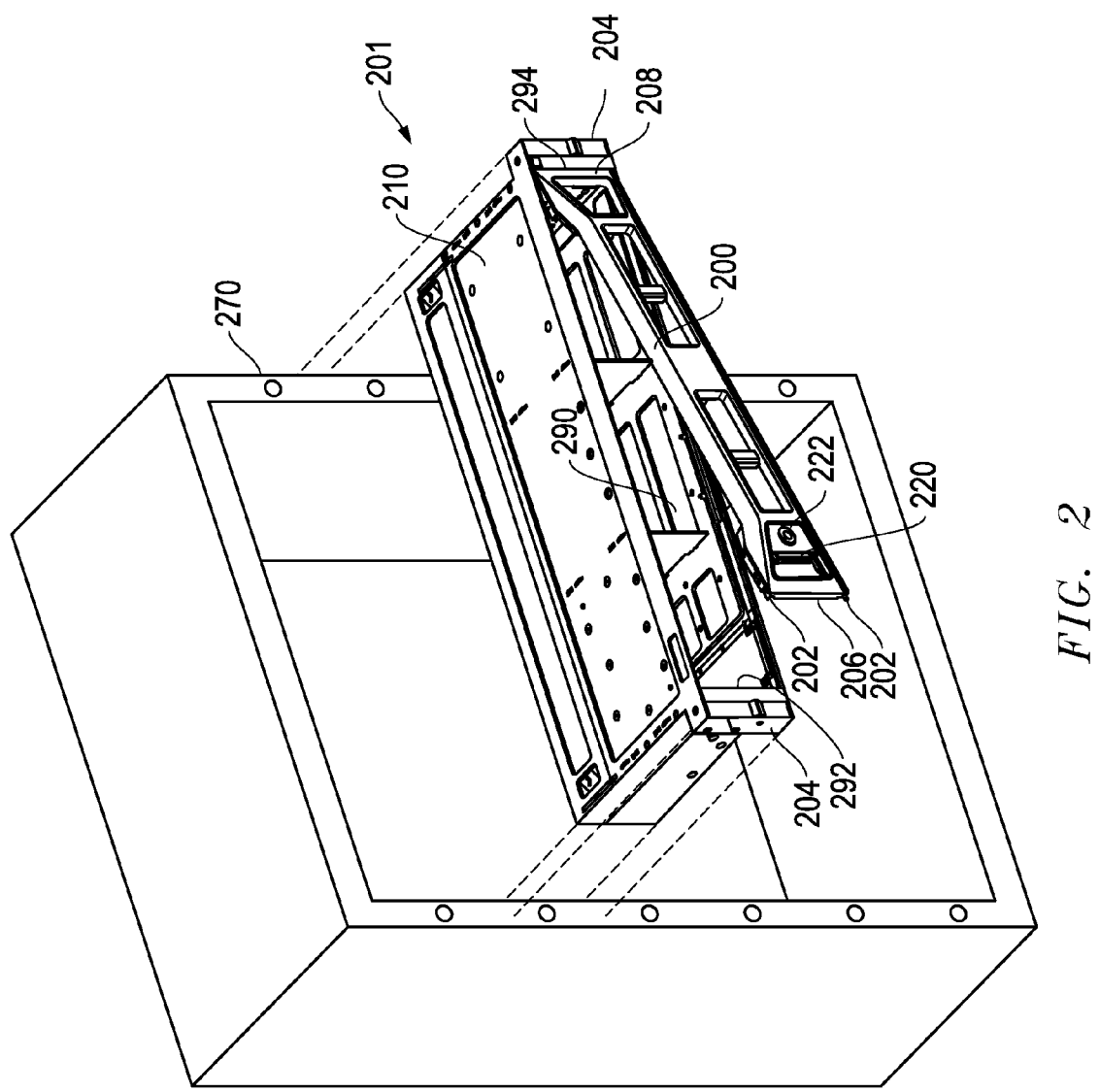
FIG. 2 illustrates a front perspective view of a rack mount chassis system and rack system configured according to one exemplary embodiment of the disclosed systems and methods.

FIG. 2 illustrates a front perspective view of a rack mount chassis system 201 including a panel 200 and a rack mount chassis enclosure 210 configured according to one exemplary embodiment of the disclosed systems and methods. In the illustrated embodiment, panel 200 is configured as a front bezel 200 having an elongated bezel body with first end 208 and a second opposing end 206, it being understood that any other type and/or size or shape of panel may be configured to be secured to an information handling system chassis enclosure in a similar manner. In FIG. 2, first end 208 of bezel 200 is shown anchored into a first side of opening 290 of chassis enclosure 210 that is defined on the front side of chassis enclosure 210 (e.g., such as 1U, 2U, 3U, 4U, etc. rack mount chassis enclosure), with second end 206 of bezel 200 positioned for insertion over and into front opening 290 in a manner as described further herein. As shown in FIG. 2, opening 290 is defined between two injection molded plastic rack mount ears 204 of chassis enclosure 210 that are themselves configured to be secured to opposing side members of a multi-chassis rack system 270 so as to mount chassis enclosure 210 with other similar chassis enclosures in the rack system 270.

Figure 3:
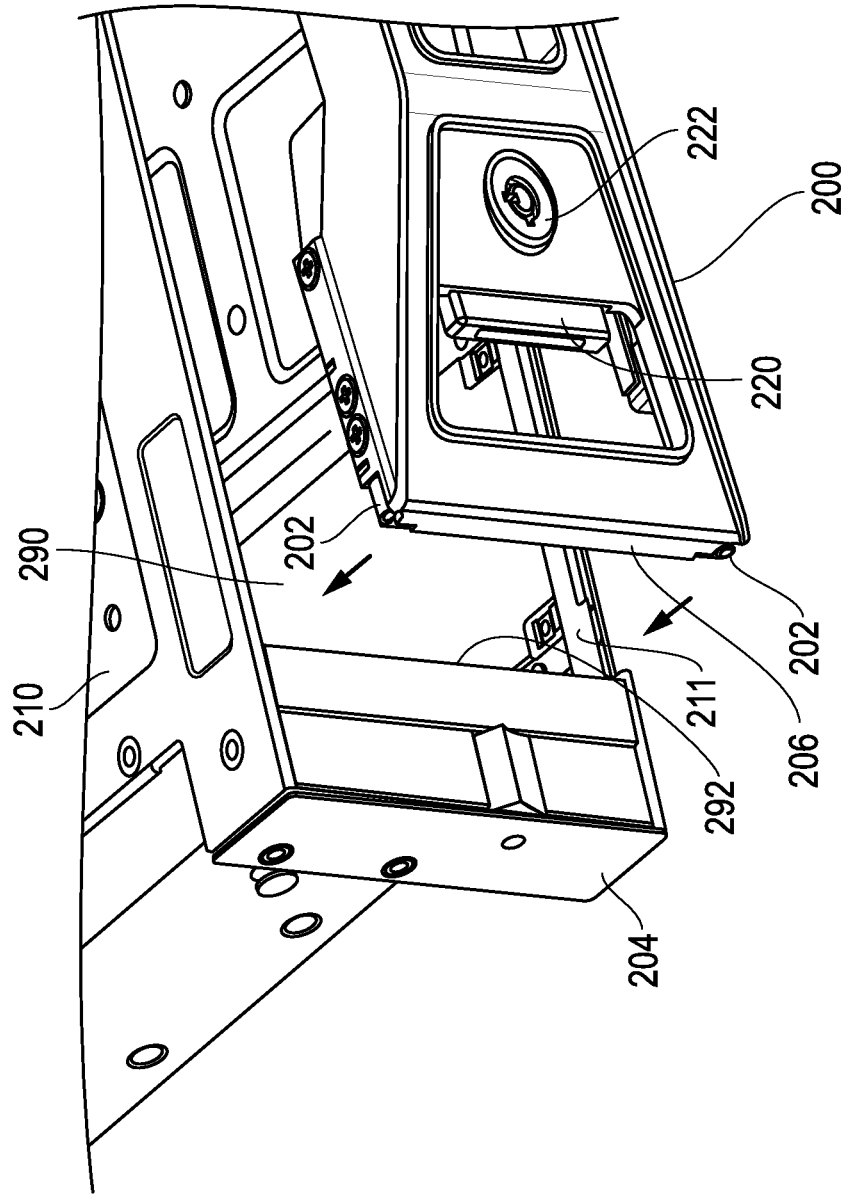
FIG. 3 illustrates a partial front perspective view of a rack mount chassis system according to one exemplary embodiment of the disclosed systems and methods.
Figure 4:
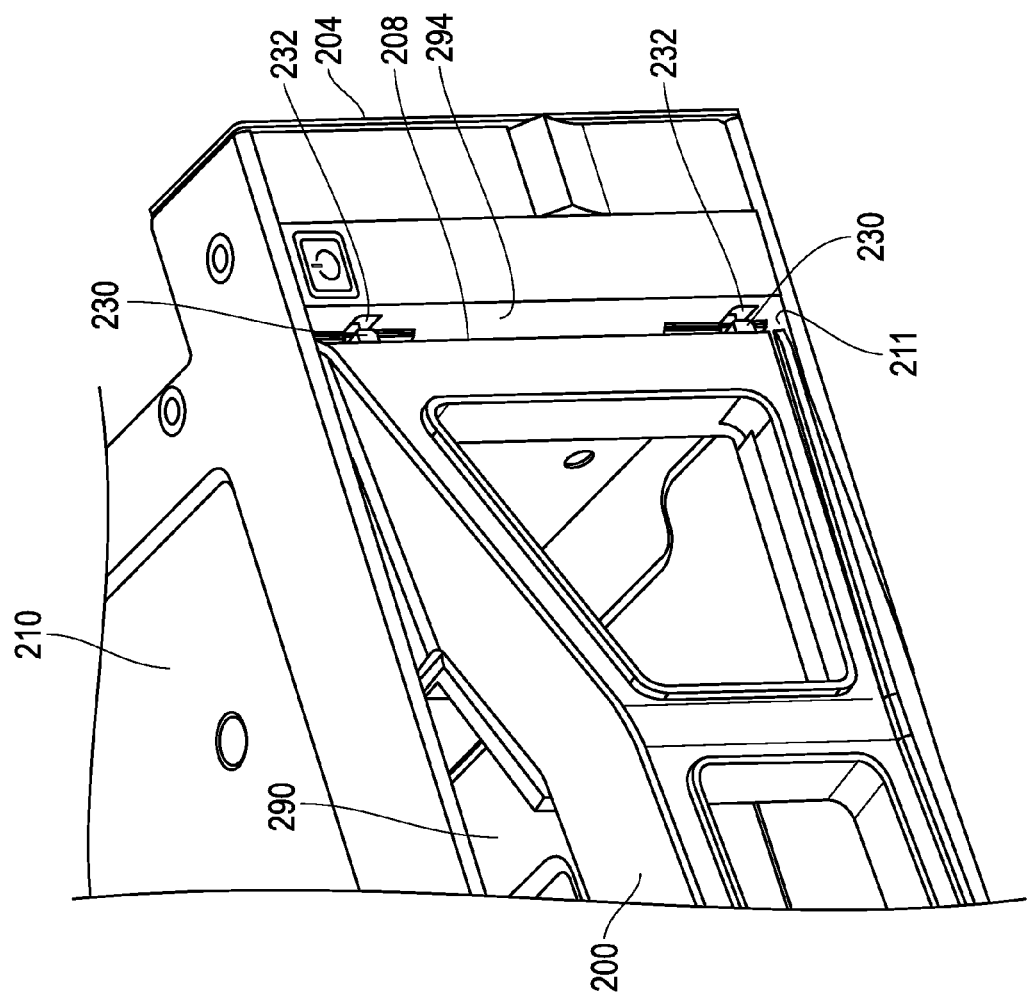
FIG. 4 illustrates a partial front perspective view of a rack mount chassis system according to one exemplary embodiment of the disclosed systems and methods.

In the illustrated embodiment of FIG. 2, the edge of a first (right) injection molded plastic end 208 of bezel 200 is configured with two spaced and extended fixed studs (e.g., hooks) 230 that are configured to be received in corresponding openings 232 defined in a first side 294 of opening 290 to anchor first end 208 of bezel 200 to the first side 294 of chassis enclosure 210 as shown in enlarged view of FIG. 4, while at the same time second (left) injection molded plastic end 206 of bezel 200 is brought together with second side 292 of opening 290 as shown in FIG. 2 and further by the arrows in enlarged view of FIG. 3. Visible in FIGS. 2 and 3 are extendable ferromagnetic latching pins 202 that are shown in a retracted position within the edge face of second end 206 of bezel 200 before second end of bezel 200 is brought together with second side 292 of opening 290. In one embodiment, plastic bezel ends 206 and 208 may be joined together by an elongated sheet metal central section, although any other suitable configuration of one or more materials may be employed.

In the illustrated embodiment, opening 290 is shown with opposing third and fourth sides 209 and 211 that are contiguous with (and extend between) first and second sides 294 and 292 of opening 290 and between which a bezel 200 may be received. However, it will be understood that in other embodiments third and fourth sides 209 and 211 may not be provided and that a bezel or other type panel may be received adjacent and over an opening 290 between just two (e.g., first and second sides) of a chassis enclosure opening. It will also be understood that one or more latching pins 202 may be provided on any given edge of a panel that are configured to be received in corresponding openings 233 defined in the face of any given side 292, 294, 209, 211 (or other) by magnetic attraction to embedded permanent magnets within the same given side.

Figure 9:
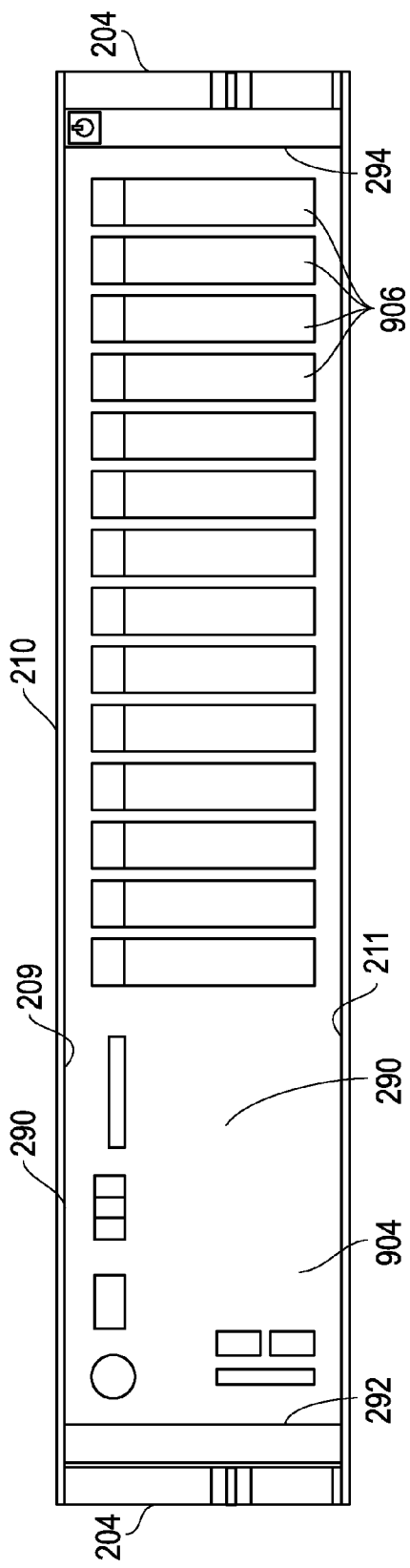
FIG. 9 illustrates a front view of a of chassis enclosure according to one exemplary embodiment of the disclosed systems and methods.
Figure 10:
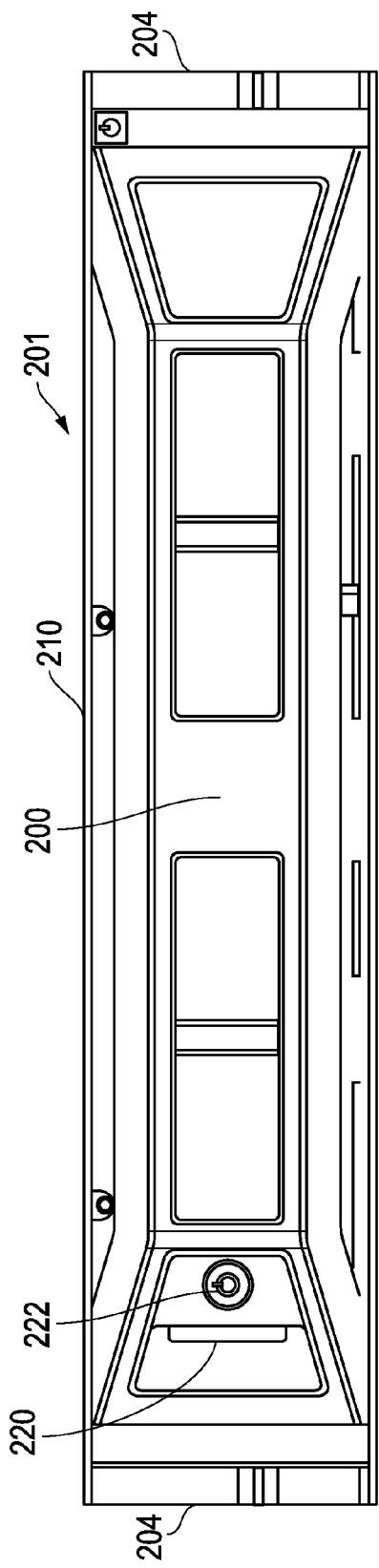
FIG. 10 illustrates a front view of a rack mount chassis system according to one exemplary embodiment of the disclosed systems and methods.

In FIGS. 2 and 3, an interior chassis cavity contiguous with opening 290 of chassis enclosure 210 is shown empty, it being understood that rack mount server components may be enclosed and operably coupled therein, such as processor/s, controller/s, memory modules, power supply unit/s, cooling fan/s, storage (e.g., hard drive, solid state drive, optical drive, etc.), connectors, input/output (I/O) components, etc. For example, FIG. 9 illustrates a front view of chassis enclosure 210 having installed components that include storage drives 906, and user interface and interconnection panel 904 (e.g., having power button, power on indicator, video connector, LCD display panel, USB connector, media card slot, etc.) together with other information handling system components such as the server components described above may also be operably positioned and coupled together within chassis enclosure 210. Further information on rack mount information handling system components may be found, for example, in U.S. Pat. No. 9,280,191 which is incorporated herein by reference in its entirety. FIG. 10 shows rack mount chassis system 201 with front bezel 210 installed within opening 290 of chassis enclosure 210 to cover components 906 and 904, e.g., to physically cover and prevent accidental or intentional access to these components once they are installed and operating in a rack mount system 270. As shown, an optional locking mechanism (e.g., barrel lock) 222 may be provided to prevent removal of bezel 210 from opening 290 of chassis enclosure 210 without an appropriate key.

Figure 5:
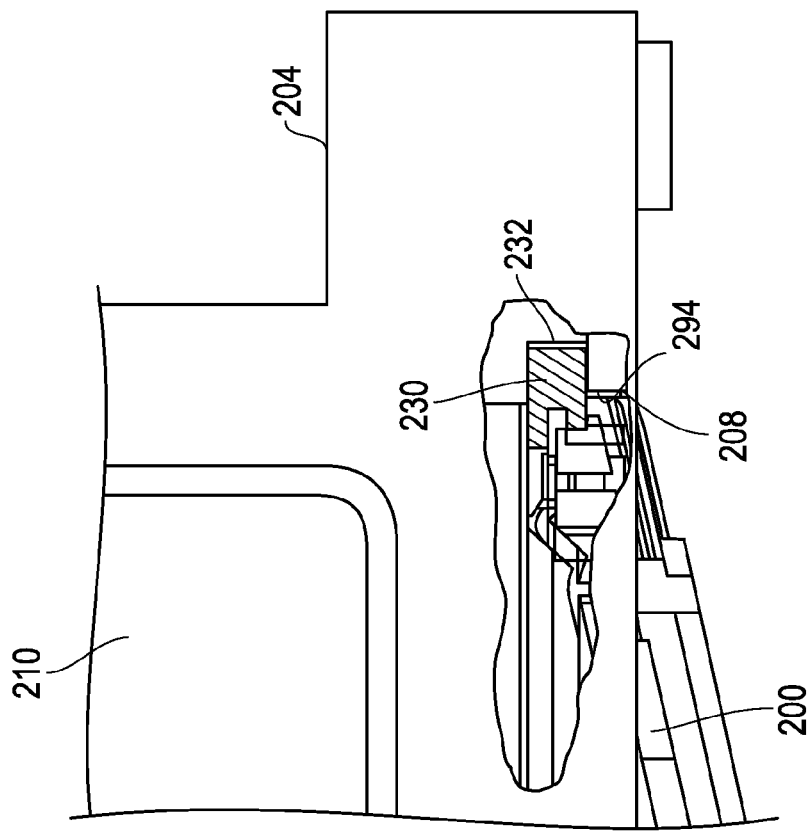
FIG. 5 illustrates an overhead sectional view of a front panel installed within a chassis enclosure opening according to one exemplary embodiment of the disclosed systems and methods.
Figure 5:
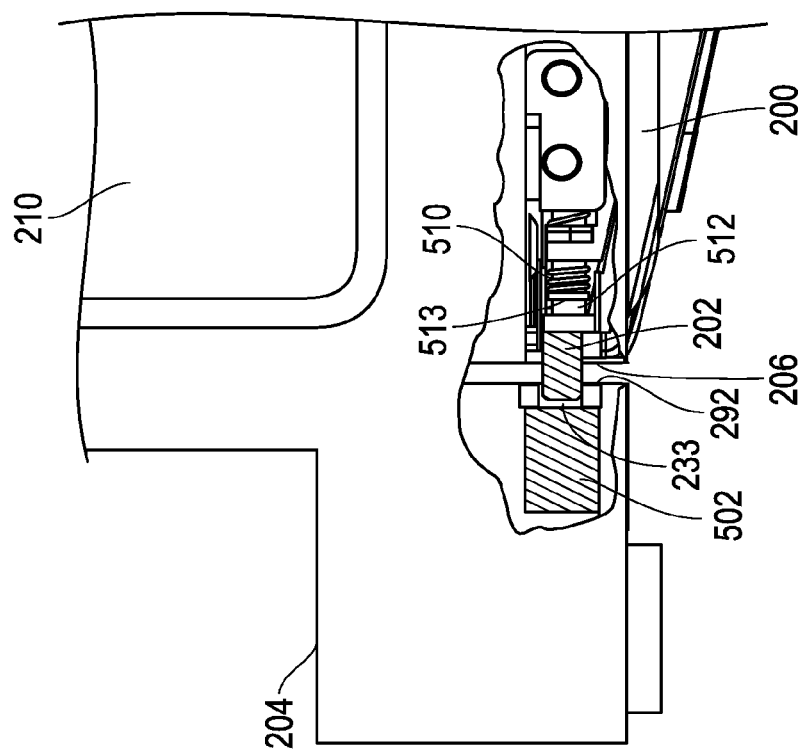

FIG. 5 illustrates an overhead sectionalized view of front bezel 210 installed within opening 290 of chassis enclosure 210. As shown in partial cut-away of FIG. 5, studs 230 are received in corresponding openings 232 defined in a first side 294 of opening 290 to anchor first end 208 of bezel 200 to the first side 294 of chassis enclosure 210. At the same time, cut-away view of FIG. 5 illustrates that ferromagnetic latching pins 202 have been pulled into extended position into corresponding openings 233 defined in a face of second side 292 by magnetic attraction to embedded permanent magnets 502 that are provided within the face of second end 206 of bezel 200 in position aligned with openings 233 and pins 202 when bezel 200 is received within opening 290 of chassis enclosure 210 in the manner shown in FIG. 10. It will be understood that openings 233 may be of any size and/or shape that is suitable for receiving extended pins 202 therein, and that openings 233 may be of the same or different dimensions as magnets 502 and/or pins 202.

Figure 8B:
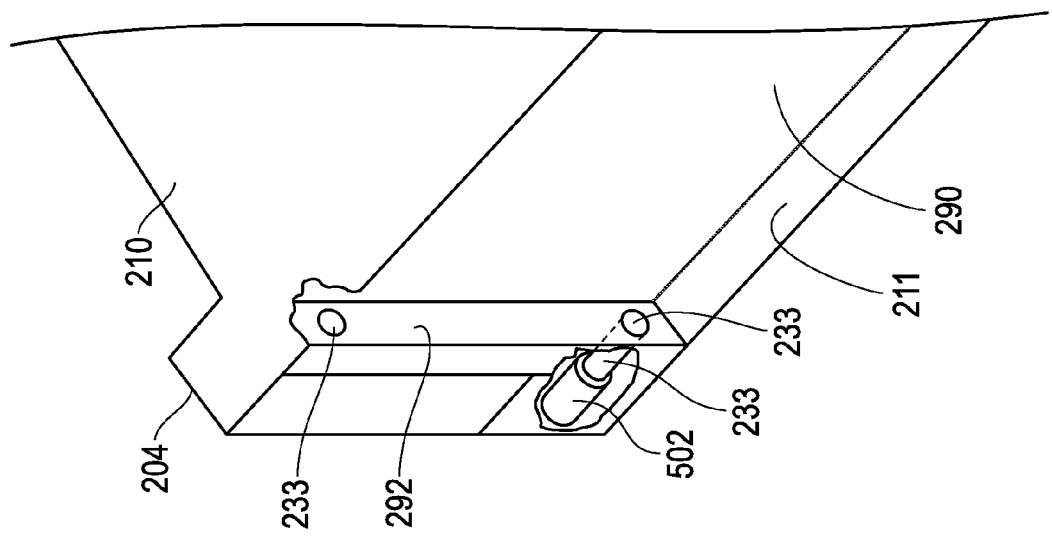
FIG. 8B illustrates a partial front perspective view of a chassis enclosure according to one exemplary embodiment of the disclosed systems and methods.
Figure 8A:
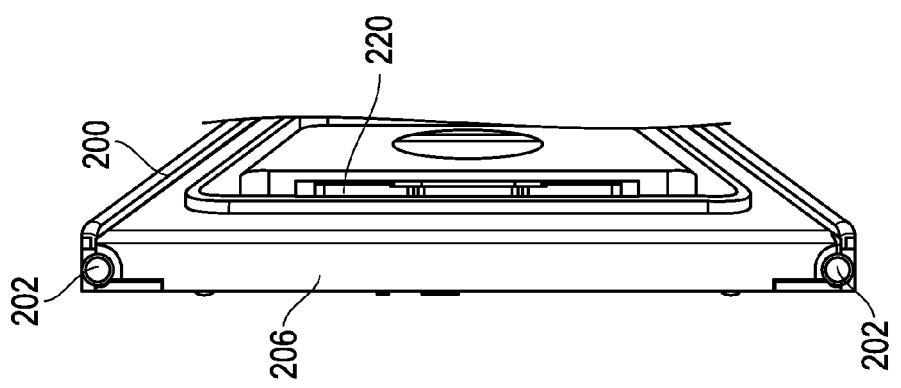
FIG. 8A illustrates a partial side perspective view of a panel according to one exemplary embodiment of the disclosed systems and methods.

FIG. 8A illustrates a perspective end view of second end 206 showing extendable pins 202 in retracted position within face of end 206 of bezel. In one embodiment, pins 202 may be configured to be flush with the face of second bezel end 206 when in retracted position so as to minimize distance to the face of second side 292 of opening 290 and embedded magnets 502 contained therein. FIG. 8B shows openings 233 defined in the face of second side 292 of opening 290 that positioned to correspond to installed position of pins 202 when bezel 200 is installed within opening 290 of chassis enclosure 210 as shown in FIGS. 5 and 10. Although described herein in relation to a front bezel for a rack mount chassis enclosure, it will be understood that the disclosed latching pins 202 may be similarly provided on one or more edges of a bezel that is configured to be secured in an opening on any other side (e.g. back, bottom, side, etc.) of a chassis enclosure, and for securing a bezel to other types of chassis enclosures, e.g., such as tower chassis enclosure for a personal computer, etc.

As shown in FIGS. 5 and 8B, magnets 502 are embedded within chassis ear 204 adjacent second side 292 of opening 290 behind each of openings 233 that have sufficient magnetic field strength in order to attract pins 202 with sufficient magnetic force to cause each of pins 202 to extend from the face of the second end 206 of bezel 200 such that pins 202 extend into openings 233 to secure bezel 200 to chassis enclosure 210 in installed position as shown in cut-away view of FIG. 5. In the illustrated embodiment, magnets 502 are each sized to have sufficient magnetic field strength at the face of a corresponding pin 202 to overcome force of a compressed retraction spring 510 (e.g., coil or helical compression spring) to pull a corresponding ferromagnetic pin 202 out of its corresponding opening within face of bezel second end 206 when bezel 200 is in installed in chassis enclosure 210. In this regard, for any particular configuration (e.g., size) of panel and its corresponding mating information handling system enclosure chassis, the size and magnetic field strength of magnets 502, the size and composition of pins 202, and the size and strength of retraction spring 510 may be selected to so that interaction of magnets 502 and pins 202 cause each of magnets 502 to pull a corresponding ferromagnetic pin 202 out of its corresponding opening within a face of a panel against the counteracting retraction force of a corresponding spring 510 when the panel is in installed in the chassis enclosure.

As a non-limiting example of magnetic field strength, in one exemplary embodiment magnetic field strength of magnets 502 may be a minimum of 2000 gauss (alternatively minimum of 1500 gauss) at the face of a corresponding pin 202 to overcome a force of a compressed retraction spring 510 (e.g., coil or helical compression spring) to pull a corresponding ferromagnetic pin 202 out of its corresponding opening within face of bezel second end 206 when bezel is in installed in chassis enclosure 210. However the above values are exemplary only and it will be understood that magnetic field strength may less than 1500 gauss or greater than 2000 gauss at the face of a corresponding pin 202. As shown, in this embodiment retraction spring 510 is mounted around a sliding shaft 512 (e.g., such as plastic shaft) to which ferromagnetic pin 202 is attached at one end, and in a configuration where force of compressed spring 510 acts to urge sliding shaft 512 and pin 202 inward. It will be understood that a retraction spring may be another type/configuration of spring and/or may be alternately configured in any suitable manner to resist extension of pins 202 from bezel end 206 into openings 233, and to cause retraction of pins 202 into bezel end 206 in the absence of attracting magnetic field force of magnets 502. It will also be understood that presence of a retraction spring 510 is optional, e.g., only a mechanical (e.g., user actuated) mechanism may be provided for withdrawing latching pins 202 into bezel end 206 from openings 233, e.g., such as latching mechanism described in relation to FIGS. 7A-7C.

Figure 6A:
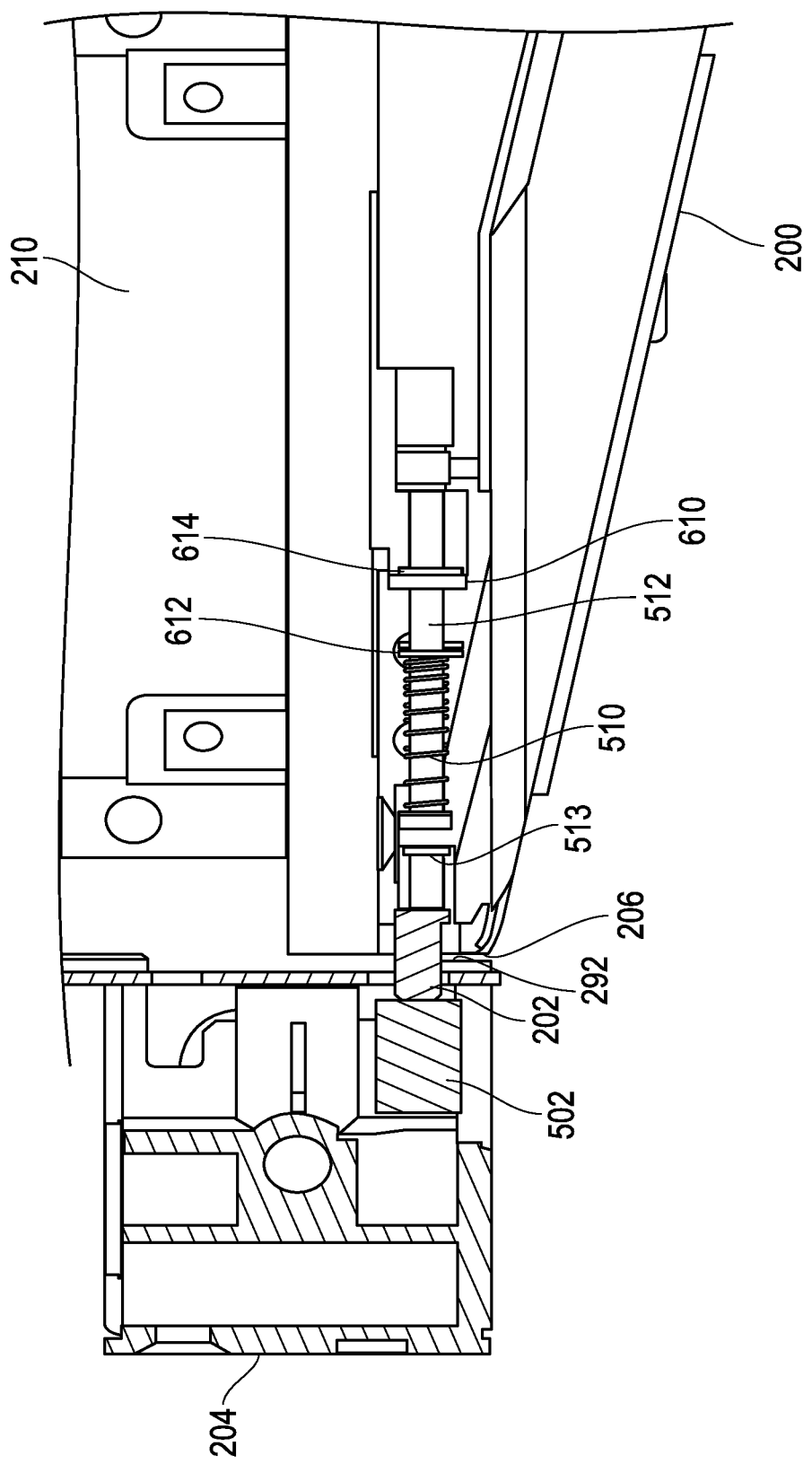
FIG. 6A illustrates a partial overhead cross sectional view of a front panel installed within a chassis enclosure opening according to one exemplary embodiment of the disclosed systems and methods.

FIG. 6A illustrates a partial overhead cross sectional view of front bezel 210 installed within opening 290 of chassis enclosure 210, which further shows compression of retraction spring 510 between a distal spring stop 612 and a proximal spring stop 513 due to movement of ferromagnetic pin 202 and its attached shaft 512 toward magnet 502 in response to the attracting magnetic field applied to the exposed end of pin 202 that exceeds the force of compressed spring 510 when pin 202 is aligned with opening 233 and magnet 502. As shown, in FIG. 6A this attracting force draws pin 202 out from bezel 200 into extended engaged position within opening 233 to secure (or latch) bezel 200 within chassis opening 290 at the same time that studs 230 are received in corresponding openings 232 defined in a first side 294 of opening 290 as shown in FIG. 5. FIG. 6B shows overhead partial cross sectional view of front bezel 210 in uninstalled condition in which compressed retraction spring 510 expands between proximal spring step 513 and distal spring stop 512 to cause shaft 510 and pin 202 to be withdrawn back into retracted position within bezel 200 in the absence of magnetic force from magnets 502. Although openings 233 are provided in one embodiment for receiving extended latching pins 202, it will be understood that any other type and/or shape of latching feature having a latching surface (e.g., full or partial ring, non-circular or non-cylindrical slot such as square or rectangular or oval slot, strike plate, etc.) may be provided within first side 292 of chassis opening 290 that is suitable for receiving an extended pin 202 in latching engagement to secure bezel 200 within opening 290. Moreover, it will be understood that latching pins 202 need not be cylindrical, but may have any other suitable cross-sectional shape, e.g., such as square, rectangular, oval, etc.

It will be understood that ferromagnetic pins 202 may be manufactured of any material that is suitably attracted by magnets 502 to withdraw pins 202 into extended position against spring 510, e.g., such as iron and iron alloys, steel, Alnico, etc. In one exemplary embodiment, pins 202 may be permanent magnets themselves with complementary magnetic fields to magnets 502 so as to further enhance the magnetic field (and corresponding attraction force) between magnets 502 and pins 202 when they are aligned in close proximity as shown in FIG. 6A. In addition to sliding shaft 512, other components of chassis ear 204 that surround and are adjacent to magnets 502 (including second face 292 of opening 290), as well as components around and near pins 202 of second end 206 of bezel 200, may be non-ferromagnetic to avoid interference with magnetic field of magnets 502.

In one exemplary embodiment, each magnet 502 may be a single magnet, such as a 0.25 inch diameter by 0.125 inch long (0.25"×0.125") grade N52 neodymium cylinder magnet configured to have a magnetic field strength in manner such as described elsewhere herein. In another exemplary embodiment, multiple magnets may be employed within a given ear opening 233, such as a 0.1875 inch diameter by 0.375 inch long (0.1875"×0.375") grade N52 neodymium cylinder magnet aligned and stacked adjacent to a 0.1875 inch diameter by 0.1875 inch long (0.1875"×0.1875") grade N52 neodymium cylinder magnet within a single opening 233. However, it will be understood that any other type and/or diameter and/or number of magnets may be employed that are suitable for creating sufficient magnetic field to attract and withdraw a pin 202 from a bezel 200 into extended latching position within a corresponding aligned opening 233 within an inside face of a chassis ear 204. It will be understood that for any given dimensional configuration of a bezel 200 and corresponding chassis opening 290, magnetic field requirement may be adjusted (e.g., by increasing diameter of magnets 502 and/or reducing nominal bezel-to-chassis rack mount ear clearance) so as to increase magnetic field strength at face of pins 202 when bezel 200 is positioned with chassis opening 290 as shown in FIGS. 5 and 10. It will also be understood that the provision of two extendable latching pins 202 on the left side of a front bezel 200 is exemplary only, and that one or more extendable latching pins may be alternately provided on one or more sides (left, right, top and/or bottom) of a front bezel to secure a front bezel 200 to a system chassis enclosure 210.

Magnetic field strength is dependent on the distance from a magnet 502 to an exposed end of a corresponding retracted pin 202. As the distance of the pin 202 from the magnet 502 increases, a larger (e.g., greater diameter) magnet is required to achieve the same magnetic field strength on the retracted pin 202. Moreover, in one embodiment, it may be desirable to maximize engagement of extended pin 202 within a corresponding opening 233, while minimizing the size (e.g., diameter) of the magnet 502 and maintaining enough clearance for repeatable insertion of bezel 200 into opening 290. However, since such variables oppose each other, tradeoffs may be made to fit the needs of a given system configuration. For example, spacing between corresponding aligned pins 202 and magnets 502 may in one embodiment be minimized (e.g., as much as possible) to increase magnetic field for any given magnet size, e.g., by decreasing spacing distance between bezel second end 206 and chassis ear inside face 292 rather than by reducing length of opening 233 and therefore engagement distance of pin 202 within opening 233 when in extended latched position (e.g., so that bezel-to-chassis ear face spacing is limited to a maximum spacing of about 0.95 millimeters, alternatively a maximum spacing of about 0.65 millimeters, alternatively a maximum spacing of about 0.75 millimeters, and further alternatively maximum spacing of about 0.15 millimeters). In one embodiment, larger diameter magnets 502 may be employed to increase magnetic field applied to a given corresponding pin 202 for a given spacing between corresponding aligned pins 202 and magnets 502. Thus, in one embodiment, both the length of pin engagement within openings 233 and the nominal installed clearance between face of bezel end 206 and surface of opening side 292 may be reduced to allow size (e.g., diameter) of magnets 502 to be reduced while still achieving a desired minimum magnetic field strength at the exposed end of pin 202 to fit a given application.

Such bezel-to-chassis ear spacing may be implemented in one exemplary embodiment to provide a gap of from about 1.3 millimeters to about 3.5 millimeters between the facing ends of retracted machined steel pin 202 (e.g., pin length of about 30 millimeter) and a corresponding aligned 0.25"× 0.125" grade N52 neodymium cylinder magnet 502 in order to achieve a magnetic field value of from about 3100 gauss to about 1300 gauss applied by magnet 502 to the exposed end of a given retracted pin 202. In another exemplary embodiment, such bezel-to-chassis ear spacing may be implemented to provide a gap that is from about 2.5 millimeters to about 4.5 millimeters between the facing ends of a retracted machined steel pin 202 and a corresponding stacked set of 0.1875"×0.375" and 0.25"×0.125" grade N52 neodymium cylinder magnets 502 to achieve a magnetic field value of from about 2000 gauss to about 790 gauss applied by the magnets 502 to the exposed end of the retracted pin 202. In yet another embodiment, a gap of 3 millimeters between the facing ends of retracted machined steel pin 202 and a corresponding aligned 5 millimeter diameter by 6 millimeter long N52 neodymium cylinder magnet 502 may be employed to achieve a magnetic field value of about 1890 gauss applied by magnet 502 to the exposed end of the given retracted pin 202. In yet another embodiment, a configuration of bezel 200 and chassis enclosure 210 may be employed that yields minimum magnetic field value of about 1500 gauss applied by a magnet 502 of varying size to the exposed end of a given retracted pin 202 may be provided. However, it will be understood that the preceding example configurations are exemplary only, and that dimensions of components, types of components, spacing between components, and/or magnetic field strengths may be different.

Returning to FIG. 6B, components of pin and associated latch components of second end 206 of bezel 200 are illustrated as they exist when bezel 200 is not installed within opening 290 of chassis 200, and thus pins 202 are not subjected to the magnetic field attraction force of magnets 502. As shown in FIG. 6B, the compressed retraction spring 510 (between distal spring stop 612 and a proximal spring stop 513) is no longer overcome by the outward attraction force of magnet 502 on the end of pin 202. Thus compressed spring 510 expands and moves shaft 512 inward with pin 202 toward the center for bezel 200 until pin 202 is once again flush with the face of bezel side 206 as shown in embodiments of FIGS. 2, 3, 6B, 7A, 8A and 11. In this condition bezel 200 is once again ready for free insertion into opening 290 of a chassis enclosure 210 as previously described.

Figure 7A:
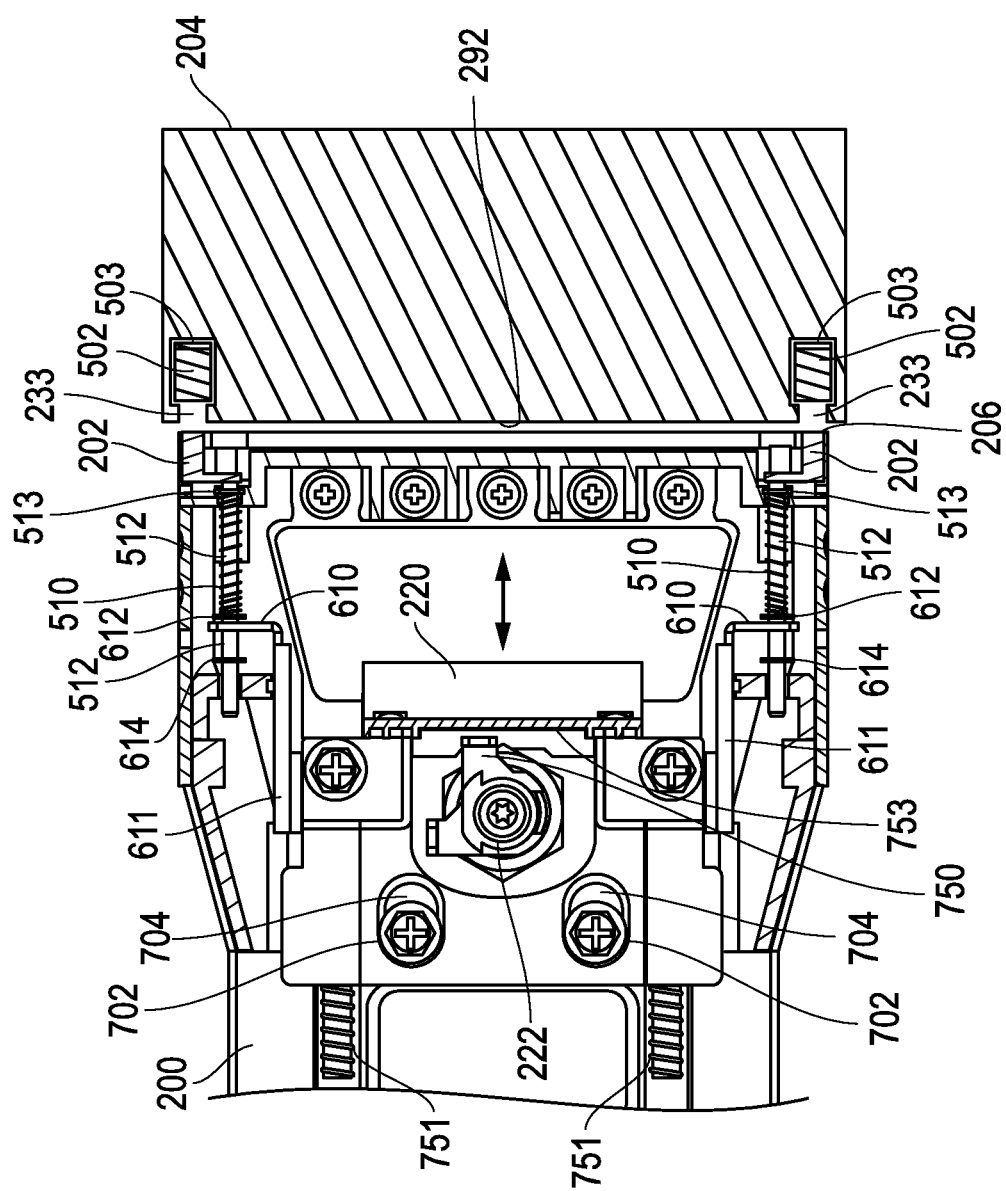
FIG. 7A illustrates a partial front cross sectional view of a front panel and a chassis enclosure according to one exemplary embodiment of the disclosed systems and methods.
Figure 7B:
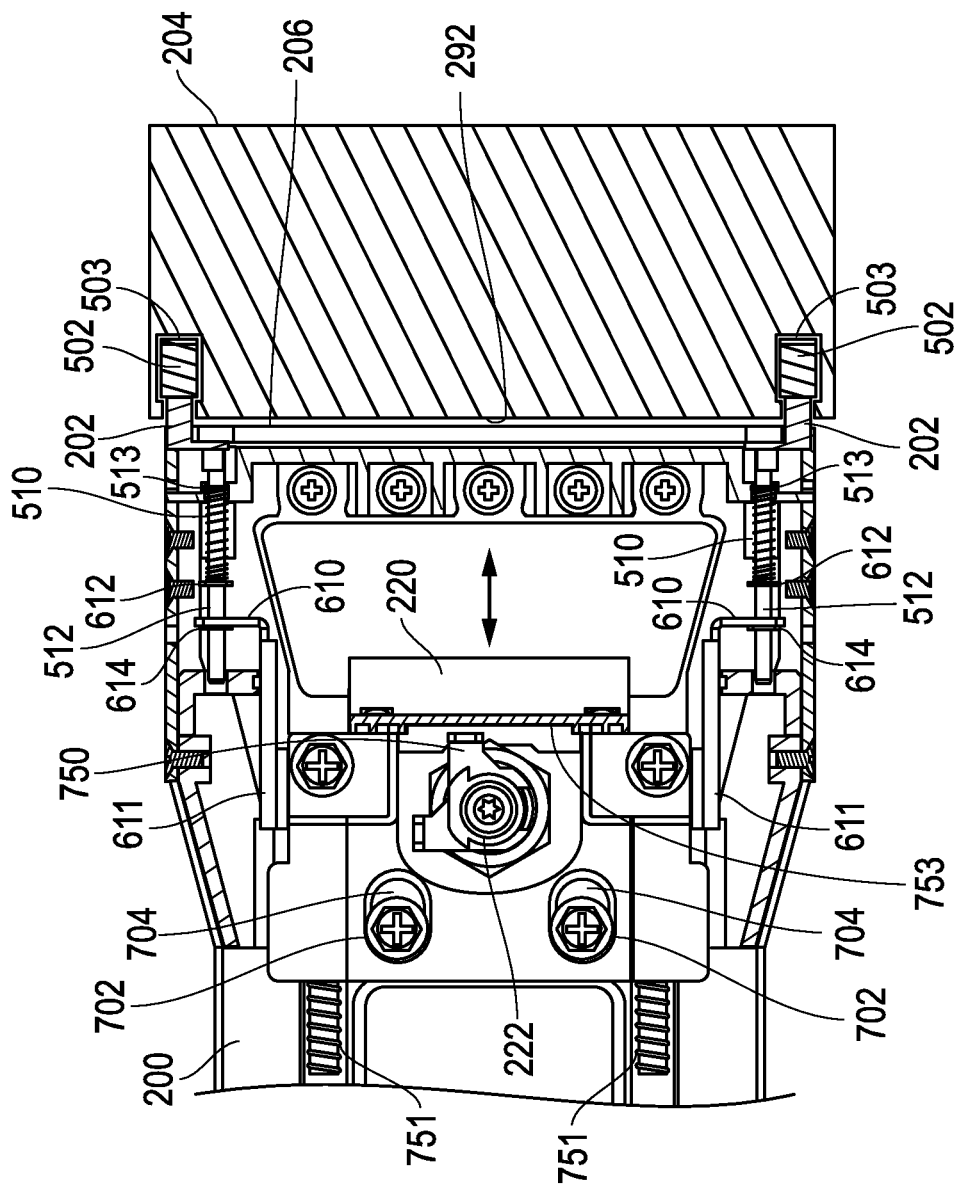
FIG. 7B illustrates a partial front cross sectional view of a front panel and a chassis enclosure according to one exemplary embodiment of the disclosed systems and methods.

FIG. 7A illustrates a partial rear cross sectional view of second end 206 of bezel 200 as it is being positioned in mated condition with chassis ear 204 just before magnetic field of magnets 502 have attracted and moved pins 202 into corresponding openings 233. FIG. 7B illustrates the same view as FIG. 7A, but after magnetic field of magnets 502 have attracted and moved pins 202 into extended position so that each of pins 202 protrudes into a corresponding aligned opening 233, i.e., by overcoming the force of compressed coil spring 520 and thus compressing coil spring 520 further. Once so extended into openings 233, pins 202 mechanically latch bezel 200 within opening 290 in a manner described elsewhere herein. In the illustrated embodiment of FIGS. 7A-7C, openings 233 of smaller diameter than magnets 502 have been defined in chassis ear 204 for receiving respective pins 202. In such a case, magnets 502 may be mounted in a relatively larger diameter opening 503 or otherwise positioned in operative position adjacent one end of each opening 233 as shown. It will be understood that magnets 233 may be shapes other than cylindrical and/or circular, e.g., such as square, rectangular shaped, etc.

Figure 7C:
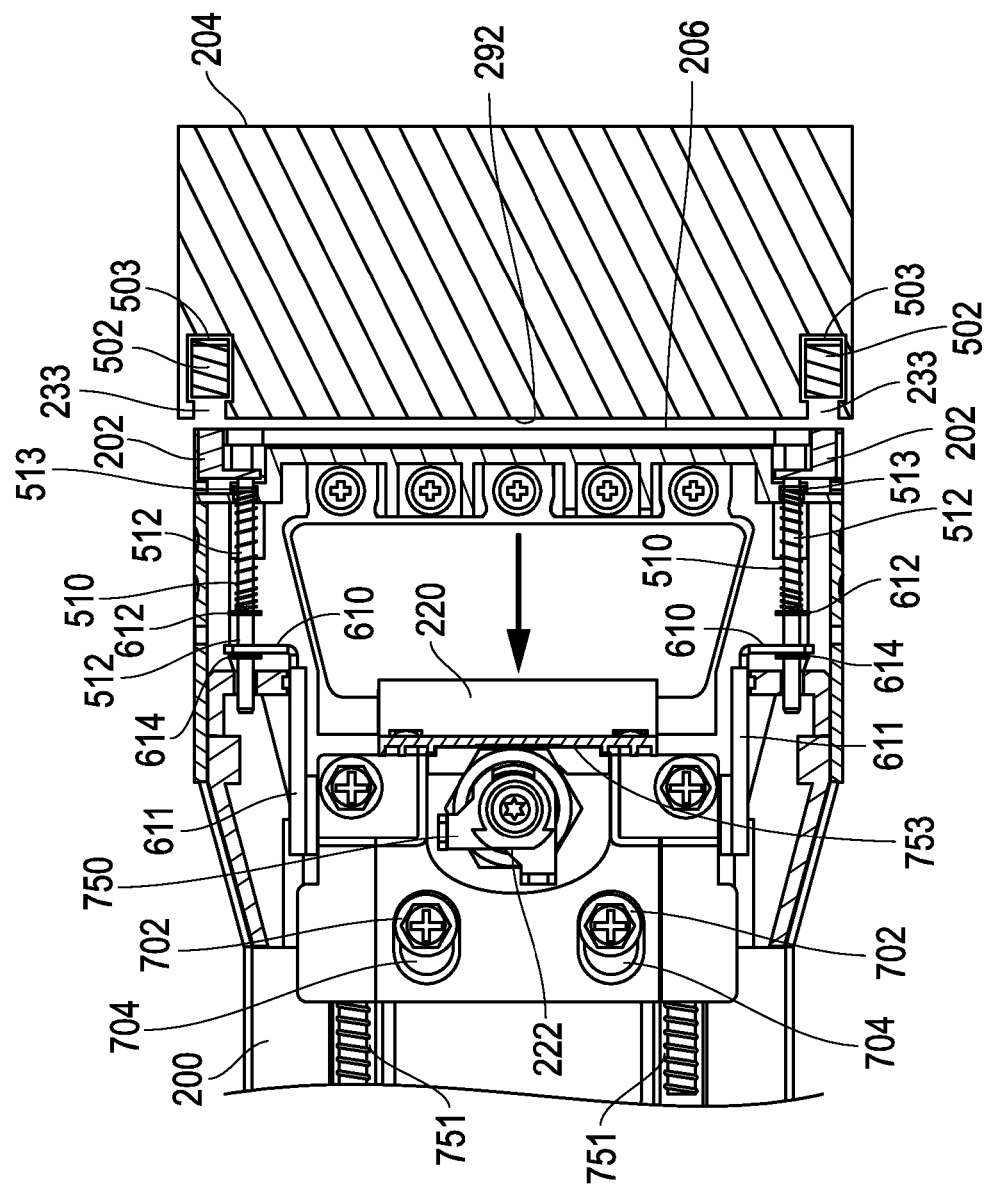
FIG. 7C illustrates a partial front cross sectional view of a front panel and a chassis enclosure according to one exemplary embodiment of the disclosed systems and methods.

Also shown in FIGS. 7A and 7B is a latch mechanism that includes latch component 220 that is configured with elongated slots 704 that are slidably received around fixed posts 702 that are coupled in mechanical fixed relationship to bezel 200 so as to allow the latch component 220 to slide horizontally inward toward center of bezel 200 and outward toward second end 206 of bezel 200 as shown by the double-sided arrows. FIG. 7C illustrates the same view as FIG. 7A, but after a hand of a user has applied an external mechanical force to the exposed surface of the latch component 220 to actuate (move) the latch component 220 in the inward horizontal direction of the arrow to cause mechanical retraction of pins 202. In this regard, a vertical latch lever 610 corresponding to each of shafts 512 is coupled by a corresponding horizontal actuation shaft 611 to latch component 220 such that inward movement of latch component 220 causes each of actuation shafts 611 to move inward together with latch levers 610. Each of latch levers 610 is in turn configured to contact and move a corresponding extension stop 614 horizontally inward together with its respective sliding shaft 512, thus withdrawing its pin 202 inward against the magnetic force of a corresponding magnet 502 and out of engagement with corresponding opening 233 as shown in FIG. 7C. In this condition, bezel 200 may now be removed from opening 290 in a manner opposite to that described with regard to installation of bezel 200 that is described in relation to FIGS. 2 and 3.

Once removed from opening 290 and proximity of magnets 502, then each compressed retraction spring 510 is allowed to expand to hold its corresponding pin 202 in retracted position as described elsewhere herein. Also illustrated in the embodiment of FIGS. 7A and 7C are compression coil springs 750 that may be present to mechanically urge latch component 220 back outward from the position of FIG. 7C to the position of FIG. 7A in the absence of inward pressure on latch component 220 applied by a human user. It will be understood that configuration and action of the latch mechanism of FIGS. 7A-7C is exemplary only, and that any other mechanism that is suitable for selectably withdrawing pins 202 inward from engagement with openings 233 may be employed.

FIGS. 7A-7B also illustrate optional locking mechanism 222 that may be provided in one embodiment to prevent user actuation of latch component 220 inward in the manner described in relation to FIG. 7C. In this regard, FIGS. 7A and 7B show locking mechanism 222 as it may be rotated (e.g., using an external key) to place blocking tab 750 adjacent an inward locking surface 735 of latch component 220 to prevent inward user movement of latch component 220 due to mechanical contact with locking tab 750 such that pins 202 cannot be removed from engagement with openings 233. FIG. 7C shows locking mechanism as it may be rotated to remove blocking tab 750 from position adjacent inward locking surface 753 in order to allow a user to move latch component 220 to cause pins 202 to be retracted as described above.

Figure 11:
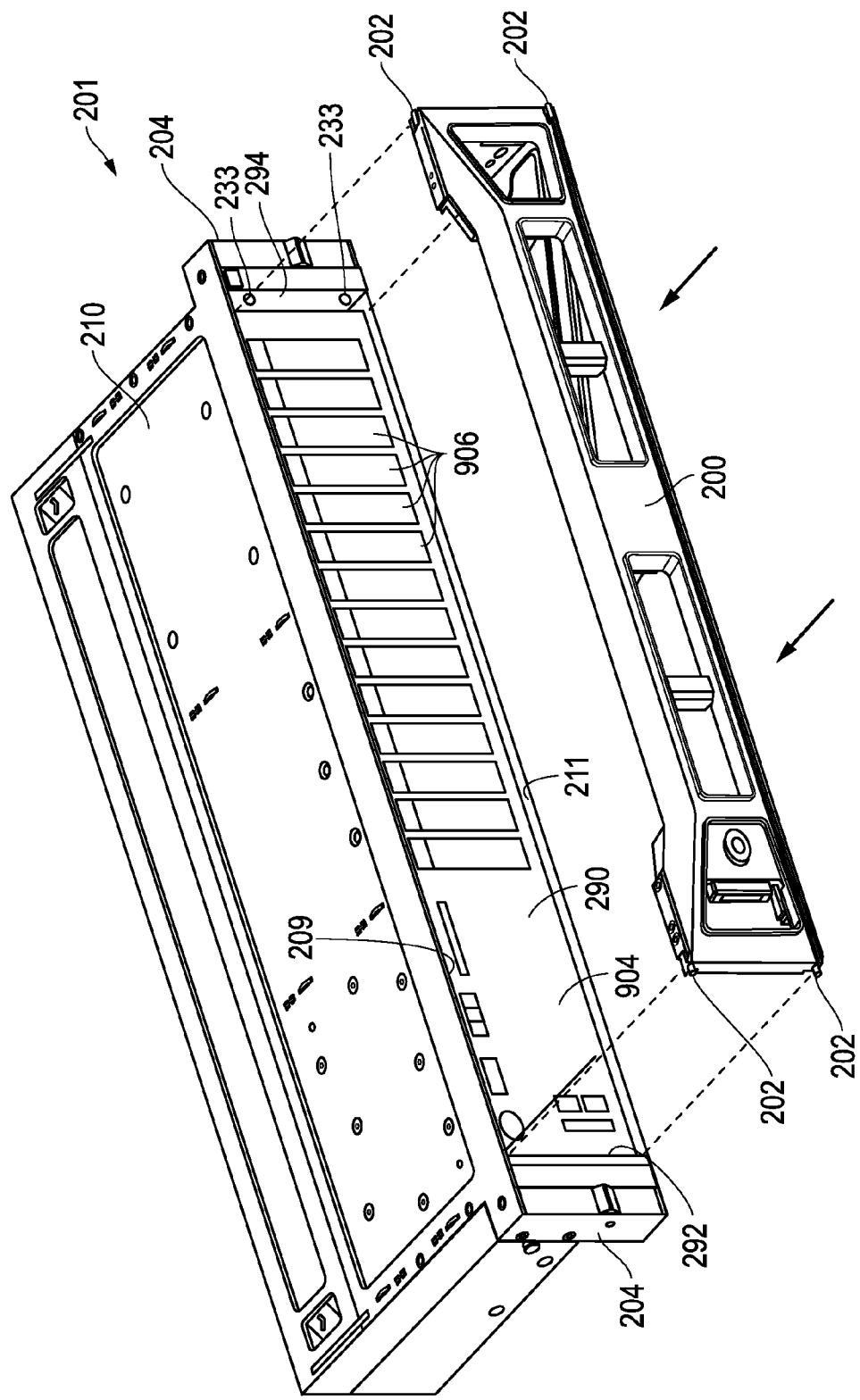
FIG. 11 illustrates a front perspective view of a rack mount chassis system according to one exemplary embodiment of the disclosed systems and methods.

FIG. 11 illustrates an alternate embodiment in which first end 208 of a bezel 200 may also be configured with extendable ferromagnetic latching pins 202 (i.e., in the same manner as second end 206 of the previous figures), rather than the spaced and extended fixed studs 230 of FIGS. 2-5. In FIG. 11, latching pins 202 are visible in cut-away sections of first end 208 of bezel 200. Chassis enclosure 210 may be configured in this embodiment with corresponding magnets 502 and openings 233 in first side 294 of opening 290 as shown in FIG. 11, i.e., in similar manner to second side 292 of opening 290. In such an alternate embodiment, a human user may install and secure bezel 200 within opening 290 of chassis enclosure 210 merely by lining up bezel 200 in substantially parallel relationship with opening 210 as shown in FIG. 11, and then inserting bezel 200 into opening 290 until pins 202 provided on each side of bezel 200 align with openings 233 on each of first side 294 and second side 292 of opening 290, at which time magnets 502 pull each of pins 202 from each of bezel ends 208 and 206 into the openings on corresponding first side 294 and second side 292 of opening 290 to secure bezel 200 within opening 290. In one embodiment, a single latch component 220 may be provided on second end 206 of bezel 200 in similar manner as previously described, in which case bezel 200 may be disengaged from one side and removed in similar manner as described in relation to FIGS. 7A and 7B. In another embodiment, a latch component 220 may be provided on each of first end 208 and second end 206 of bezel 200 to allow a user to retract pins 202 from engagement with corresponding openings 233 in either or both of first and second sides 294 and 292 of opening 290 in order to disengage and remove bezel 200 from opening 290.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A panel configured to be received over an opening of a chassis enclosure, the panel comprising:
   a panel body; and
   at least one ferromagnetic latching pin provided within at least one edge of the panel;
   where the latching pin is configured to move outward from the edge of the panel to at least partially extend from the panel edge toward a side of the chassis opening to secure the panel over the chassis enclosure opening in response to an external magnetic force applied to the latching pin from the side of the chassis opening.

2. The panel of claim 1, where the latching pin is configured to move outward from the edge of the panel to at least partially extend from the panel edge toward a first side of the chassis opening to secure the panel over the chassis enclosure opening in response to a magnetic force applied to the latching pin from at least one magnet mounted at the first side of the chassis opening when the panel is received over the chassis enclosure opening.

3. The panel of claim 1, further comprising a retraction spring within the panel that is coupled to retain the latching pin in a retracted position within the panel in the absence of the external magnetic force, and to move the latching pin from the at least partially extended position to the retracted position when the external magnetic force applied to the latching pin is removed.

4. The panel of claim 1, further comprising a latch component coupled to be actuated by a user to move the latching pin from the at least partially extended position to a retracted position in the presence of the external magnetic force applied to the latching pin so as to allow the panel to be removed from the chassis enclosure opening.

5. The panel of claim 1, where the panel is an elongated panel having first and second opposing ends; where the latching pin is provided within an edge of the second end of the panel; and where the panel further comprises at least one fixed stud extending from the first end of the panel.

6. The panel of claim 1, where the panel is an elongated panel having opposing first and second ends; where a first ferromagnetic latching pin is provided within an edge of the first end of the panel; where a second ferromagnetic latching pin is provided within an edge of the second end of the panel; and where each of the first and second ferromagnetic latching pins are configured to move outward and at least partially extend from a respective panel edge toward a corresponding side of the chassis opening to secure the panel over the chassis enclosure opening in response to an external magnetic force applied to the latching pin.

7. The panel of claim 1, where the panel is a front bezel configured to be received over a front opening of a rack mount chassis enclosure for an information handling system.

8. A chassis enclosure system for an information handling system, comprising:
a chassis enclosure having an opening defined therein and configured to receive a panel over the opening; and
at least one magnet mounted at one or more sides of the chassis enclosure opening, the magnet being positioned to apply a magnetic force to a ferromagnetic latching pin provided within at least one edge of the panel when the panel is received over the chassis enclosure opening so as to cause the latching pin to move outward from the edge of the panel to at least partially extend from the panel edge toward the side of the chassis opening to secure the panel over the chassis enclosure opening.

9. The system of claim 8, where a side opening is defined in at least one side of the chassis enclosure opening between the magnet and an inner face of the chassis enclosure opening, the side opening being configured to receive the partially extended latching pin when the panel is received over the chassis enclosure opening with the side opening and the latching pin in aligned relationship.

10. The system of claim 8, where the panel is an elongated front bezel; where the opening defined in the chassis enclosure is an elongated front chassis enclosure opening having opposing first and second sides and configured to receive the elongated front bezel having first and second opposing ends with the first end of the bezel positioned adjacent the first side of the chassis enclosure opening and with the second end of the bezel positioned adjacent the second side of the chassis enclosure opening; where the at least one magnet is mounted at the second side of the chassis enclosure opening; and where at least one side opening is defined at the first side of the chassis enclosure that is configured to receive at least one fixed stud extending from the first end of the elongated bezel at the same time that the magnet causes the latching pin to move outward from the edge of the bezel to at least partially extend from the bezel edge toward the side of the chassis opening such that the latching pin is received in a second side opening defined at the second side of the chassis enclosure to secure the bezel over the chassis enclosure opening.

11. The system of claim 8, where the panel is an elongated front bezel; where the opening defined in the chassis enclosure is an elongated front chassis enclosure opening having opposing first and second sides and configured to receive the elongated front bezel having first and second opposing ends with the first end of the bezel positioned adjacent the first side of the chassis enclosure opening and with the second end of the bezel positioned adjacent the second side of the chassis enclosure opening; where the at least one magnet includes a first magnet mounted at the first side of the chassis enclosure opening and a second magnet mounted at the second side of the chassis enclosure opening; and where the first magnet is configured to cause a first latching pin of the bezel to outwardly extend from the edge of the first end of the bezel toward the first side of the chassis opening such that the first latching pin is received in a first side opening defined at the first side of the chassis enclosure at the same time that the second magnet is configured to cause a second latching pin of the bezel to outwardly extend from the edge of the second end of the bezel toward the second side of the chassis opening such that the second latching pin is received in a second side opening defined at the second side of the chassis enclosure to secure the bezel over the chassis enclosure opening.

12. The system of claim 8, further comprising the panel received over the chassis enclosure opening with the latching pin at least partially extending from the panel edge toward the side of the chassis opening to secure the panel over the chassis enclosure opening.

13. The system of claim 12, where the panel further comprises a latch component coupled to be actuated by a user to move the latching pin from the at least partially extended position to a retracted position in the presence of the external magnetic force applied to the latching pin so as to allow the panel to be removed from the chassis enclosure opening.

14. The system of claim 12, where the panel is an elongated front bezel; where the bezel is an elongated bezel having opposing first and second ends and where the opening defined in the chassis enclosure is an elongated front chassis enclosure opening having opposing first and second sides; where a first ferromagnetic latching pin is provided within an edge of the first end of the bezel and a second ferromagnetic latching pin is provided within an edge of the second end of the bezel; where a first magnet is provided at the first side of the chassis enclosure opening and a second magnet is provided at the second side of the chassis enclosure opening; and where each of the first and second ferromagnetic latching pins are held in at least partially extended position from a respective edge of the bezel toward a corresponding respective first or second side of the chassis opening by external magnetic force applied by a corresponding respective first or second magnet to secure the bezel over the chassis enclosure opening.

15. The system of claim 8, where the chassis enclosure comprises a rack mount chassis enclosure for an information handling system.

* * * * *